United States Patent [19]

Yamazaki

[11] Patent Number: 5,469,615
[45] Date of Patent: Nov. 28, 1995

[54] METHOD FOR ELECTRICAL INTERCONNECTION OF METALLIC PATTERNS

[75] Inventor: Hideo Yamazaki, Sagamihara, Japan

[73] Assignee: Minnesota Mining and Manufacturing Company, St. Paul, Minn.

[21] Appl. No.: 238,535

[22] Filed: May 5, 1994

[51] Int. Cl.$^6$ ............................................. H05K 3/02
[52] U.S. Cl. .............................. 29/846; 29/849; 174/261
[58] Field of Search ................. 29/846, 849; 156/901, 156/902; 174/261

[56] References Cited

U.S. PATENT DOCUMENTS

| | | | |
|---|---|---|---|
| 3,301,730 | 1/1967 | Spiwak et al. | 29/846 X |
| 3,528,048 | 9/1970 | Kirk | 29/846 X |
| 3,628,243 | 12/1971 | Phol et al. | 29/849 |
| 4,920,639 | 5/1990 | Yee | 174/261 X |
| 5,063,658 | 11/1991 | Wild | 29/846 |

*Primary Examiner*—Carl J. Arbes
*Attorney, Agent, or Firm*—Gary L. Griswold; Walter N. Kirn; David W. Anderson

[57] ABSTRACT

A method for electrical interconnection of a first metallic pattern deposited on a dielectric film to a second metallic pattern, comprising the steps of forming on one side, of the dielectric film opposite the side where the first metallic pattern is deposited, grooves sufficiently deep to reach the first metallic pattern, preparing the second metallic pattern having such a thickness that it is fitted into the grooves formed in the dielectric film and can be in contact with the first metallic patterns, and fitting into the grooves formed in the dielectric film the second metallic patterns to join the metallic patterns to each other under pressure.

3 Claims, 4 Drawing Sheets

METHOD FOR ELECTRICAL INTERCONNECTION OF METALLIC PATTERNS

BACKGROUND OF THE INVENTION

Field of the Invention

The present invention relates to a method for electrical interconnection of metallic patterns on dielectric film.

Prior Art

For a compact and light weight design of an electrical product, the high density of an inner board is essential. For this high density of the board, interconnections between the boards have to be formed with a high density. A high-accuracy aligning apparatus, however, is required for interconnection between connection terminals formed with a high density on the wiring boards. Connectors or the like, if applied for such purpose, take up a relatively large space in the electrical device.

For electrical interconnection of flexible printed circuit boards (FPC), tape automated bonding (film carrier )(TAB), printed wiring board (right board) (PWB) and the like it has been proposed to form connection terminals in a part of the wiring board, align the formed terminals to each other, and thereafter to connect the terminals to each other by using an antisotropic conductive film or a low melt point metal such as solder. For the electrical interconnection of the terminals at a fine pitch, however, specifically at a pitch of 400 μm or less, by using a solder or an anisotropic conductive film, it is necessary to align the portions of the terminals to be connected with each other with an extremely high accuracy, and thus a special bonding machine is required for this purpose. If this alignment is not sufficiently accurate, a poor connection or a connection between wrong terminals, so-called short-circuit, will result.

Also in case the conventional method is used in which metallic patterns are connected to each other with a metallic pattern deposited on a dielectric film being placed against that on another film, the metallic patterns cannot be sufficiently secured and may possibly be displaced laterally due to an external mechanical stimulation or the like. Thus they cannot be stably connected.

In addition, if the conventional method is used in which a metallic pattern is placed against another metallic pattern, the thickness of the metallic pattern conductor adds to that of the other metallic pattern conductor so that the users demand for thinner wiring boards cannot be met.

Furthermore, for interconnection of wiring boards, resin-molded type connectors may be provided on the connection parts of two dielectric films and they are connected to each other. In this case, however, the interconnecting pitch is limited to 1 mm or so and the connectors themselves are rather massive.

The present invention is intended to provide a method for electrical interconnection of a metallic pattern on dielectric film, by which a metallic pattern deposited with a high density on a dielectric film can be connected to another metallic pattern without using any special aligning apparatus, the interconnection being highly stable, incurring no short-circuit between the metallic patterns and being very thin.

As a result conducting various studies for solving the problems, the inventor found a method for accurate interconnection of metallic patterns on dielectric films by forming grooves in the dielectric film on which a metallic pattern is deposited, said grooves extending from the opposite side to the side where the metallic pattern is deposited, and putting, as guided by the grooves, a metallic pattern deposited on another dielectric film or a metallic pattern alone into contact with each other.

SUMMARY OF THE INVENTION

The present invention provides a method for electrical interconnection of a first metallic pattern deposited on a dielectric film to a second metallic pattern comprising the steps of:

(1) forming, on the opposite side to a side, of the dielectric film, where the first metallic pattern is deposited, grooves so deep as to reach the first metallic pattern;

(2) preparing the second metallic pattern having such a thickness that it is fitted into the grooves formed in the dielectric film and can be in contact with the metallic patterns; and (3) fitting into the grooves formed in the dielectric film the second metallic pattern to join the metallic patterns to each other under pressure.

Note that the interconnection of the metallic patterns means an electrical connection of them. The metallic patterns facing each other may be fused to each other or they may be connected to each other with a solder or anisotropic conductive film placed between them.

In case the solder or anisotropic conductive film, namely, electric connections other than the metallic patterns are used, the depth of the second metallic pattern is determined taking the thickness of such electric connections into consideration.

According to the present invention, the grooves formed in the dielectric film from the back side thereof guide the other metallic pattern. Thus, the metallic patterns can be accurately connected to each other without using any high performance complicated aligning apparatus.

Also according to the present invention, the metallic lines are completely insulated from each other, thus permitting to perfectly prevent any short-circuit between the lines, and the dielectric film having metallic pattern deposited thereon has buried therein the other metallic pattern. Therefore, it is possible to prevent the metallic patterns from laterally displacing and to design a thin interconnection.

According to the present invention, the grooves formed in the back side of the dielectric film serve to guide the second metallic pattern on the other dielectric film. Therefore, two different metallic patterns can be accurately connected to each other without using any high performance, complicated aligning apparatus.

According to the present invention, the conductive lines can be perfectly isolated from each other, thus completely preventing any short-circuit even if the conductive lines are deposited at a small pitch. The dielectric film having a metallic pattern deposited thereon has buried therein another metallic pattern, thus permitting to prevent the metallic patterns from laterally displacing and to design thinner connections.

Therefore, the present invention meets the recent strict demand for stable connection and ultra-thin design.

DETAILED DESCRIPTION OF THE PRESENT INVENTION

The method according to the present invention is definitely explained, by way of example, with reference to the drawings.

Figure 1:
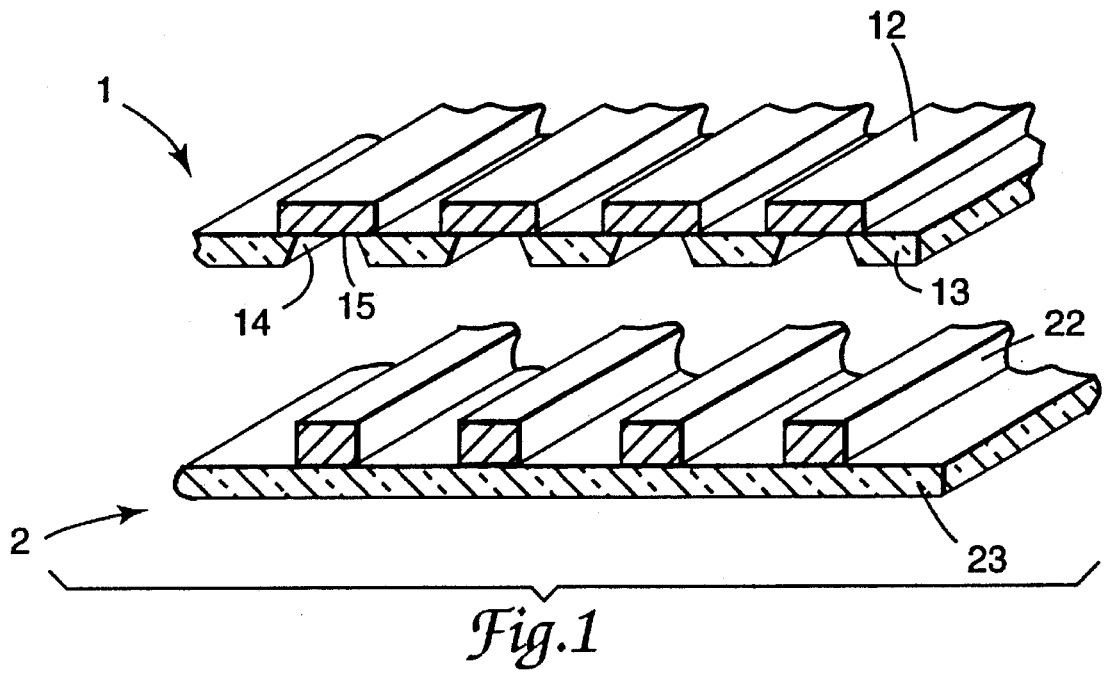
FIG. 1 is a sectional perspective view showing the structure of circuit boards to be connected by the method according to the present invention.

FIG. 1 is the sectional perspective view of wiring boards 1 and 2 having dielectric films 13 and 23, respectively, on which there are deposited metallic patterns 12 and 22, respectively, to be connected by the method according to the present invention. In the wiring board 1, the dielectric film 13 has the metallic pattern 12 deposited thereon and the dielectric film 13 has grooves 14 formed on the opposite side to the side where the metallic pattern 12 are deposited. Each groove 14 extends in parallel with the metallic pattern 12 and has the top 15 of the groove defined by the bottom of the metallic pattern 12. That is, the groove 14 is a cut through the thickness of the dielectric film 13.

Figure 2:
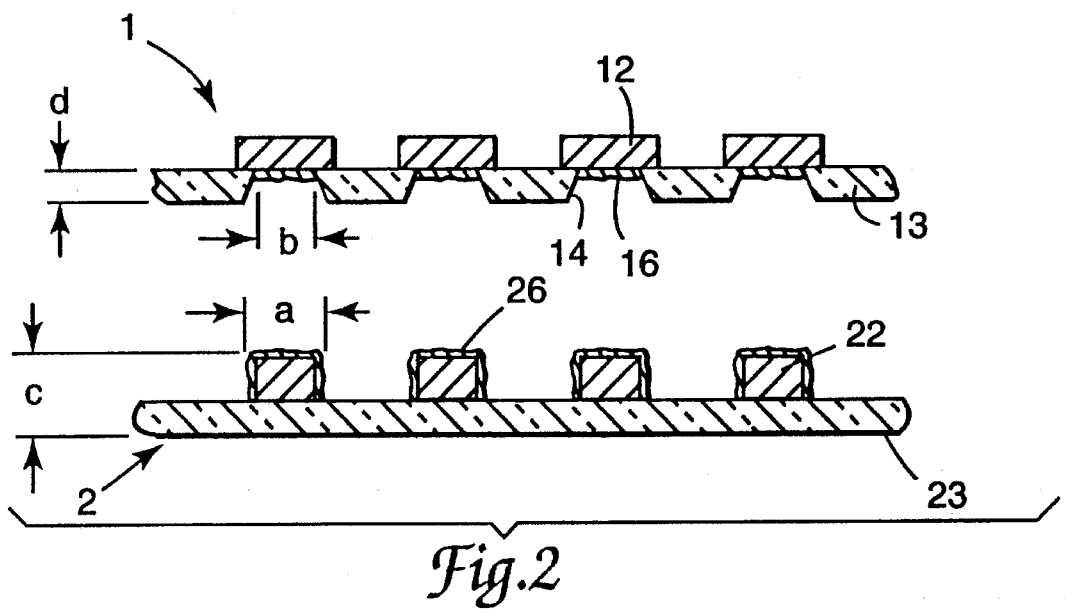
FIG. 2 is a sectional view showing the structure of circuit board to be connected by the method according to the present invention.
Figure 3:
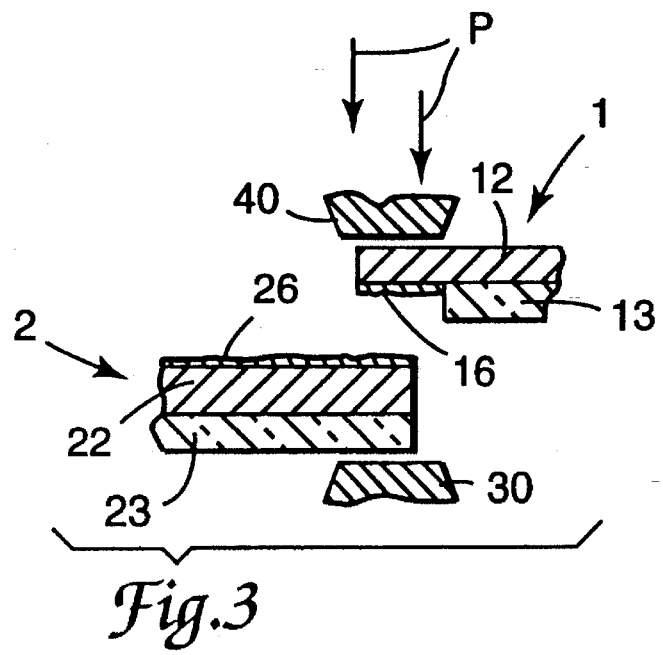
FIG. 3 is a schematic diagram for explanation of the method according to the present invention.

The other wiring board 2 is composed of the dielectric film 23 and metallic pattern 22 deposited on the film 23. For electrical connection between the metallic patterns 12 and 22, the metallic pattern 12 deposited on the dielectric pattern 23 is fitted into the groove 14 formed in the dielectric film 13. For a good connection between the integrity of the wiring boards 1 and 2 in this case, the metallic patterns 12 and 22 should preferably be put into contact with each other with a low melting point metal, for example, solders 16 and 26 as shown in FIGS. 2 and 3. An anisotropic conductive film or paint may be used in place of the low melting point metals 16 and 26. Further, an insulative resin may be used instead. This is because if used for interconnection of metallic patterns with a narrow pitch in the present invention, such material will permit a point contact between the metallic patterns.

For an electrical connection between the metallic pattern 12 and 22, obtained by fitting the metallic pattern 22 on the dielectric film 23 into the grooves 14 formed in the dielectric film 13, the width a of the metallic pattern 22 (a width including the thickness of a solder or the like 26, if applied, covering the metallic pattern 22) should preferably be equal to or smaller than the width b of the groove top 14, and the thickness c of the metallic patterns 22 (a thickness including the thickness of a solder or the like 26, if applied, covering the metallic patterns 22) should also preferably be equal to or larger than the groove depth d (thickness of the wiring board 1; a thickness excluding that of a solder or the like if applied, covering the metallic patterns 12). At the ends of the dielectric films, however, the groove width may not necessarily be smaller than the conductor width of the metallic patterns; it may be determined taking the easy connectability into consideration.

The effect of the present invention is attainable because at the end of dielectric film, the metallic pattern can be held and secured longitudinally.

Figure 4A:
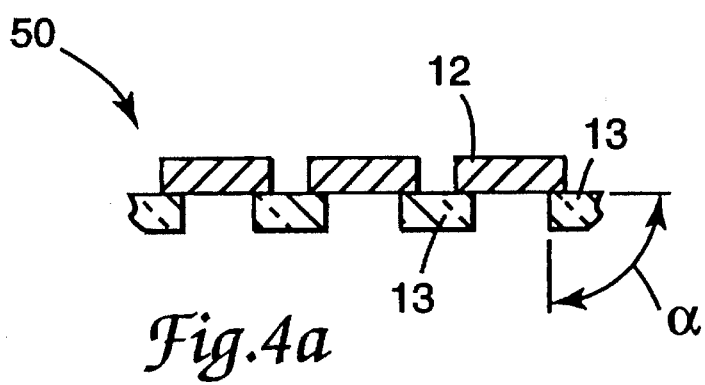
FIG. 4 is a sectional view showing the grooves formed in the circuit boards to be connected by the method according to the present invention.
Figure 4B:
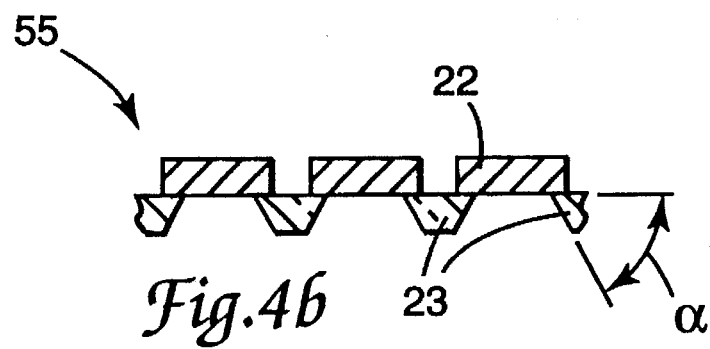

The grooves may be formed with their walls extended at a right angle ($\alpha=90°$) with respect to the plane of the dielectric film 13 as shown in FIG. 4A, or with the width of the groove opening (bottom) being smaller than that of the groove top ($\alpha<90°$), namely, the groove takes the form of a trapezoid, as shown in FIG. 4B. The value $\alpha$ may be selected from the range of 90° to 20°. For better guiding of the metallic pattern 22 by the groove 14, the groove 14 should preferably have the sectional form of a trapezoid ($\alpha<90°$).

FIG. 3 is a schematic sectional view of the wiring boards 1 and 2 in FIG. 1 taken along the extending direction of the metallic pattern, showing the method according to the present invention. As shown, the wiring boards 1 and 2 are placed as stacked one on another between a stage 30 and bonding head 40, the metallic patterns 12 and 22 are put into contact with the solder layers 16 and 26, and the bonding head 40 is forced toward the stage 30 in the direction of arrows P. Simultaneously with this pressurizing, the contact portions are fused to each other as they are heated to a higher temperature than the melting point of the solders 16 and 26.

Figure 5:
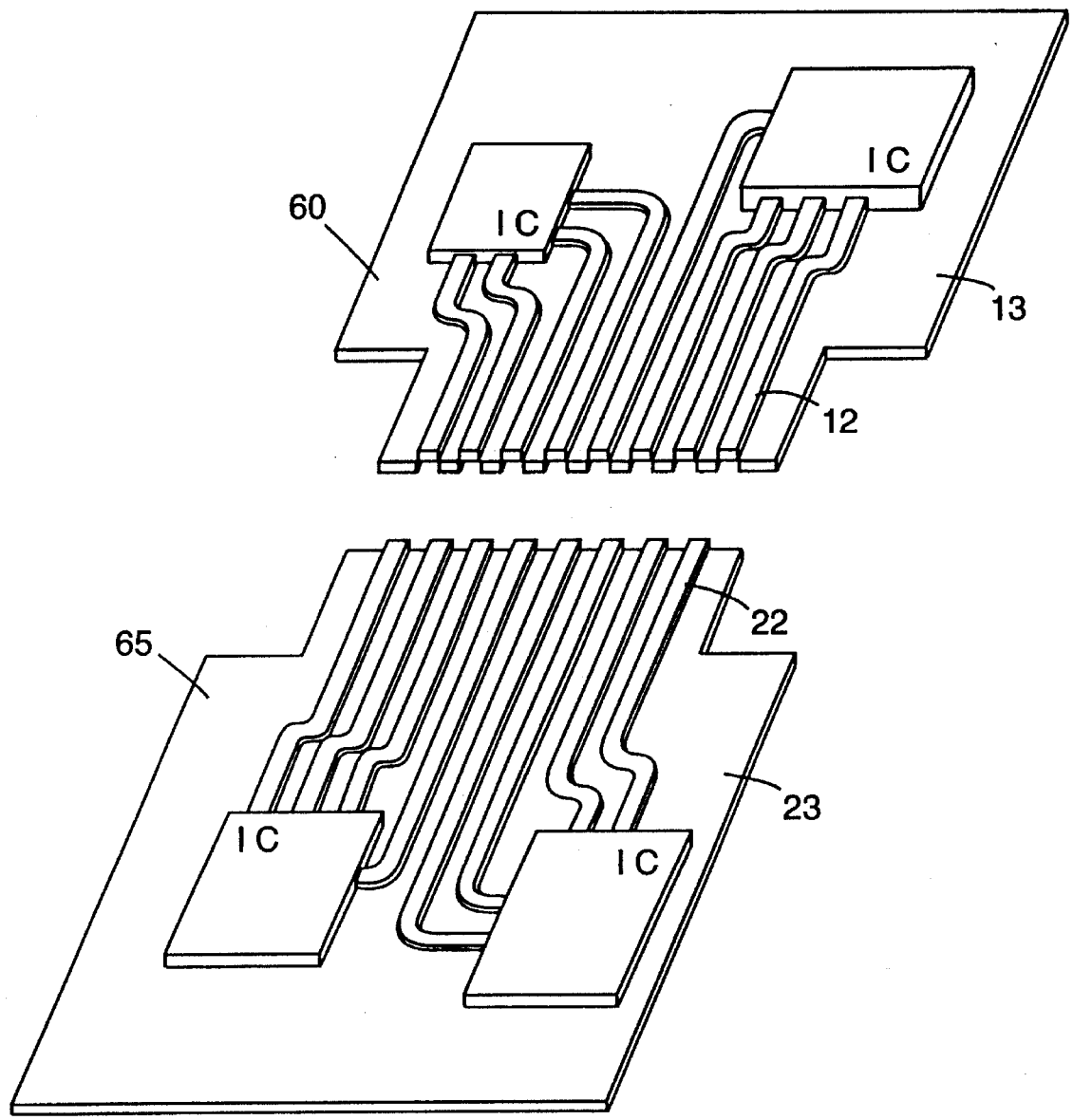
FIG. 5 is a perspective view of an embodiment of circuit boards 60 and 65, each comprising a dielectric film 13 or 23, metallic pattern 12 or 22 and integrated circuits.
Figure 6:
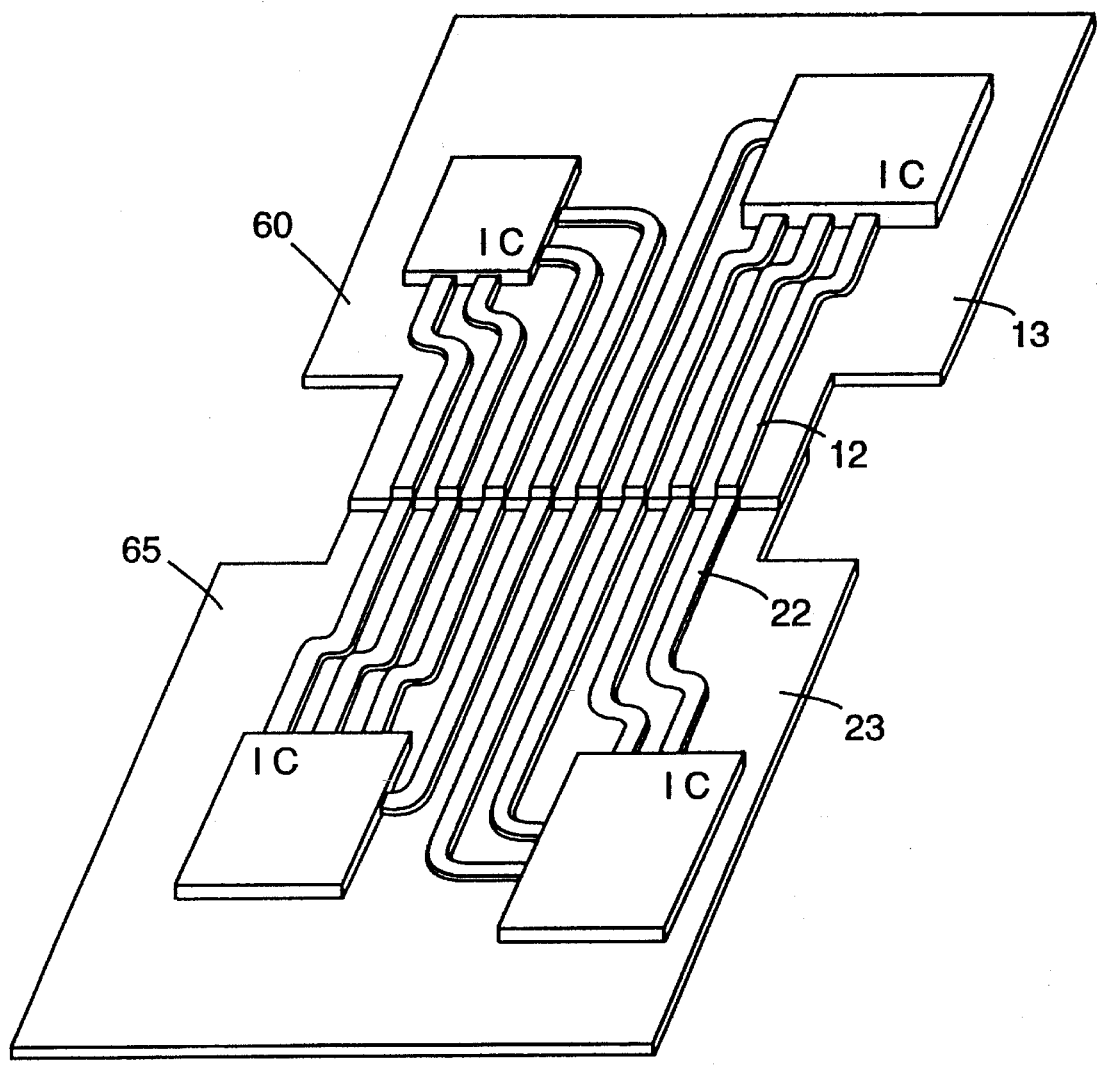
FIG. 6 is a perspective view of connected circuit boards prepared by pressing the circuit board 60 and 65 shown in FIG. 5, wherein the metallic patterns 12 and 13 are electrically connected.

FIGS. 5 and 6 show a practical application of the present invention. In FIG. 5, 60 represents a circuit board comprising a dielectric film 13, metallic pattern 12 and integrated circuits; and 65 represents a circuit board comprising a dielectric film 23, metallic pattern 22 and integrated circuits. The circuit boards 60 and 65 are pressed as shown in FIG. 6, resulting in connection of the metallic patterns 12 and 22. In a preferred embodiment, when the width of the metallic pattern is about 100 μm, the length of overlapping portions of the metallic pattern is about 1 to 10 mm.

The material of the dielectric film, material of the metallic pattern, method for depositing or forming the metallic pattern on the dielectric film, anisotropic conductive film, paint or solder for electric interconnection of the metallic patterns, etc., are not any part of the features of the present invention as any conventional techniques may be adopted. Also, the groove 14 on the film 13 may be formed in the dielectric film by a conventional cutting technique such as chemical etching, laser processing, NC machining.

More particularly, the material of the dielectric film can be selected from among the group comprising polyimide, polyester, polyamide for FPC, from the group of polyimide and polyester for TAB, from among epoxy, polyimide, a composite resin of either the epoxy and polyimide with a glass fiber cloth for PWB. Such materials are commercially available under the trade name of Kapton (with polyimide as base, from DuPont), Lumirror (with polyester as base, from Toray) or the like. The dielectric film is 12.5 to 125 μm thick for FPC, 25 to 125 μm for TAB or 0.3 to 2.0 mm for PWB. The metallic pattern is made of copper, copper alloy, aluminum or the like. For forming the metallic pattern on the dielectric film, a subtractive, additive, semi-additive, or laminate process or the like is employed.

Due to the low melting point, metal used for interconnection of the metallic patterns, solder, tin, indium or the like is used. These metals are melted at a temperature, for example, of 150° to 250° C. Otherwise, one of the metallic patterns to be connected to each other may be gold-plated while the other metallic pattern is tin-plated, and the metallic patterns may be heated at a temperature higher than 350° C. to produce a gold-tin alloy for joining them to each other. The anisotropic conductive film for use to interconnect the metallic patterns is disclosed in, for example, European Patent Application No. 0 421 709 A1, and it is commercially available under the trade name of Scotch Link 5303R from the Sumitomo 3M Ltd.

For forming the grooves in the dielectric film by a chemical etching, a certain solvent or aqueous alkali solution is used in case the dielectric film is made of polyimide.

Having described the present invention it will be appreciated there may be modifications to the embodiments described without departing from the spirit of the invention.

I claim:

1. A method for electrical interconnection of a first metallic pattern deposited on a dielectric film to a second metallic pattern, comprising the steps of:

forming on the opposite side to a side, of said dielectric film where the first metallic pattern is deposited, grooves so deep as to reach the first metallic pattern preparing the second metallic pattern having such a thickness that it can be fitted into the grooves formed in said dielectric film and can be in contact with the first metallic pattern, and fitting into said grooves formed in said dielectric film the second metallic pattern to join said metallic patterns to each other under pressure.

2. A method according to claim 1, wherein said joining under pressure is done with an anisotropic conductive film.

3. A method according to claim 1, wherein said joining under pressure is done with a low melting point metal placed between said metallic patterns.

* * * * *